(12) United States Patent
Choi et al.

(10) Patent No.: US 10,035,297 B2
(45) Date of Patent: Jul. 31, 2018

(54) APPARATUS AND METHOD FOR GENERATING BITMAP OF 3-DIMENSIONAL MODEL

(71) Applicant: SAMSUNG SDS CO., LTD., Seoul (KR)

(72) Inventors: Kwang-Min Choi, Seoul (KR); Sung-Ho Jang, Seoul (KR); Jae-Young Park, Seoul (KR); Sang-Hoon Han, Seoul (KR)

(73) Assignee: SAMSUNG SDS CO., LTD., Seoul (KR)

( * ) Notice: Subject to any disclaimer, the term of this patent is extended or adjusted under 35 U.S.C. 154(b) by 68 days.

(21) Appl. No.: 15/059,718

(22) Filed: Mar. 3, 2016

(65) Prior Publication Data
US 2016/0260248 A1    Sep. 8, 2016

(30) Foreign Application Priority Data

Mar. 3, 2015  (KR) .................. 10-2015-0029747

(51) Int. Cl.
*B29C 64/386* (2017.01)
*B33Y 50/00* (2015.01)
*G06K 15/02* (2006.01)
*G06T 17/00* (2006.01)
*G06T 19/00* (2011.01)
*G06F 17/50* (2006.01)
*H04N 1/00* (2006.01)
(Continued)

(52) U.S. Cl.
CPC ............ *B29C 64/386* (2017.08); *B29C 64/00* (2017.08); *B33Y 50/00* (2014.12); *G05B 19/4099* (2013.01); *G06F 17/50* (2013.01); *G06K 15/1836* (2013.01); *G06K 15/1889* (2013.01); *G06T 17/00* (2013.01); *G06T 19/00* (2013.01); *H04N 1/00827* (2013.01)

(58) Field of Classification Search
CPC ............ B29C 67/0051; B29C 67/0085; B29C 67/0088; B29C 67/0092; B29C 67/0077; B33Y 99/00; B33Y 30/00; B33Y 10/00; B33Y 50/00; B33Y 50/02; G05B 2219/49007; G05B 2219/49008; G05B 2219/49023; H04N 13/00
See application file for complete search history.

(56) References Cited

U.S. PATENT DOCUMENTS 5,943,235 A * 8/1999 Earl .................. B29C 41/36
345/420
6,169,605 B1 * 1/2001 Penn .................. B29C 67/0059
358/1.1
(Continued)

*Primary Examiner* — Scott A Rogers
(74) *Attorney, Agent, or Firm* — Sughrue Mion, PLLC

(57) ABSTRACT

Disclosed are an apparatus and method of generating a bitmap of a 3D model. The apparatus for generating a bitmap of a 3D model includes a pixel column generator configured to divide a 3D space into a plurality of pixel columns parallel to an output direction of a 3D printer, an intersection point calculator configured to calculate intersection points between the plurality of pixel columns and the 3D model, a rasterizer configured to rasterize the pixel columns and determine a support material region in each of the rasterized pixel columns based on the intersection points; and a bitmap generator configured to generate the bitmap of the 3D model by merging the rasterized pixel columns.

20 Claims, 12 Drawing Sheets

(51) Int. Cl.
   *G05B 19/4099* (2006.01)
   *B29C 64/00* (2017.01)

(56) References Cited

U.S. PATENT DOCUMENTS

| | | | | |
|---|---|---|---|---|
| 2014/0303942 A1* | 10/2014 | Wighton | ............. | B29C 67/0092 703/1 |
| 2014/0324204 A1* | 10/2014 | Vidimce | ............. | B29C 67/0088 700/98 |
| 2015/0091208 A1* | 4/2015 | Sadusk | ............... | B29C 67/0092 264/308 |
| 2015/0266242 A1* | 9/2015 | Comb | ................... | G03G 15/224 264/40.1 |
| 2015/0269282 A1* | 9/2015 | Nelaturi | ................... | G06F 17/50 700/98 |
| 2016/0019319 A1* | 1/2016 | Shtilerman | ............. | G06T 17/10 264/308 |
| 2016/0151979 A1* | 6/2016 | Urban | ................. | B29C 67/0092 264/308 |
| 2017/0032561 A1* | 2/2017 | Choi | ...................... | G06K 15/02 |

* cited by examiner

APPARATUS AND METHOD FOR GENERATING BITMAP OF 3-DIMENSIONAL MODEL

CROSS-REFERENCE TO RELATED APPLICATION

This application claims priority to and the benefit of Korean Patent Application No. 10-2015-0029747, filed on Mar. 3, 2015, the disclosure of which is incorporated herein by reference in its entirety.

BACKGROUND

1. Field

Embodiments of the present disclosure relate to technology of generating a bitmap of a three-dimensional (3D) model for 3D printing.

2. Discussion of Related Art

In the case of a material-jetting three-dimensional (3D) printing method such as poly jet or Multi Jet Modeling (MJM), a support material for supporting a floating part is required in a printing process in order for the part not to flow down, and a region in which the support material is to be formed should be determined before a 3D model is printed.

In the related art, Korean Patent No. 10-0450358 includes dividing an output object in a direction perpendicular to an output direction of a 3D printer, calculating a part material region and a support material region in the direction perpendicular to the output direction of the 3D printer, and outputting the calculated part material region and support material region when the 3D model is output.

However, in the related art, only after finding a position of a part material for each layer, merging bitmaps of all part materials of tops of each layer and each of the layers (OR), and finding a Boolean difference between the merged bitmap and a bitmap indicating a part material position of a corresponding layer (XOR) to complete a support material bitmap of the corresponding layer, the 3D printer may start outputting. As a result, since positions of support material regions should be sequentially calculated beginning with a top layer in the related art, parallelization is impossible, and a very large amount of calculation is required.

Furthermore, in the related art, part material and support material bitmaps of a bottom layer needed for a 3D printer to start outputting may not be preferentially calculated. Thus, part material regions of all upper layers should be calculated in order to know a support material region of the bottom layer.

Accordingly, in the related art, the 3D printer may start outputting only after generating part material bitmaps of all layers.

SUMMARY

Embodiments of the present disclosure are directed to an apparatus and method for generating a bitmap of a three-dimensional (3D) model for 3D printing.

According to an aspect of the present disclosure, there is provided an apparatus for generating a bitmap of a three-dimensional (3D) model, the apparatus including a pixel column generator configured to divide a 3D space into a plurality of pixel columns parallel to an output direction of a 3D printer, an intersection point calculator configured to calculate intersection points between the plurality of pixel columns and the 3D model, a rasterizer configured to rasterize the pixel columns and determine a support material region in each of the rasterized pixel columns based on the intersection points; and a bitmap generator configured to generate the bitmap of the 3D model by merging the rasterized pixel columns.

The rasterizer may determine, as the support material region, a pixel positioned between the intersection points among pixels corresponding to empty spaces in each of the rasterized pixel columns.

The rasterizer may determine, as the support material region, a pixel positioned below an initial intersection point among pixels corresponding to empty spaces in each of the rasterized pixel columns.

The apparatus may further include a transmitter configured to transmit the bitmap to the 3D printer.

The transmitter may sequentially transmit bitmaps of planes perpendicular to the output direction on the basis of the output direction.

According to another aspect of the present disclosure, there is provided a method of generating a bitmap of a three-dimensional (3D) model, the method including dividing a 3D space into a plurality of pixel columns parallel to an output direction of a 3D printer, calculating intersection points between the plurality of pixel columns and the 3D model, rasterizing the pixel columns, determining a support material region in each of the rasterized pixel columns based on the intersection points, and generating the bitmap of the 3D model by merging the rasterized pixel columns.

The determining may include determining, as the support material region, a pixel positioned between the intersection points among pixels corresponding to empty spaces in each of the rasterized pixel columns.

The determining may include determining, as the support material region, a pixel positioned below an initial intersection point among pixels corresponding to empty spaces in each of the rasterized pixel columns.

The method may further include transmitting the bitmap to the 3D printer.

The transmitting may include sequentially transmitting bitmaps of planes perpendicular to the output direction on the basis of the output direction.

According to another aspect of the present disclosure, there is provided an apparatus for generating a bitmap of a three-dimensional (3D) model, the apparatus including: a pixel column generator configured to divide a 3D space into a plurality of pixel columns parallel to an output direction of a 3D printer, a reference coordinate setter configured to set a coordinate of the output direction of a plane perpendicular to the output direction as a reference coordinate, an intersection point calculator configured to calculate an initial intersection point between each of the plurality of pixel columns and the 3D model, the initial intersection point having the coordinate of the output direction equal to or greater than the reference coordinate, a rasterizer configured to rasterize pixels having the reference coordinate in each of the pixel columns and determine a pixel corresponding to a support material region among the rasterized pixels based on whether the initial intersection point is present; and a bitmap generator configured to generate a bitmap of the plane by merging the rasterized pixels.

the rasterizer may determine, as the support material region, a pixel corresponding to empty space when the initial intersection point is present.

The reference coordinate setter may increase the reference coordinate by a pixel size of the output direction when the generation of the bitmap of the plane is completed, and the intersection point calculator and the rasterizer may end the initial intersection point calculation and the rasterization when the reference coordinate is greater than an output direction coordinate of a top plane in the 3D space or a top coordinate of the output direction of the 3D model.

The apparatus may further include a transmitter configured to transmit the bitmap of the plane to the 3D printer.

According to another aspect of the present disclosure, there is provided a method of generating a bitmap of a three-dimensional (3D) model, the method including dividing a 3D space into a plurality of pixel columns parallel to an output direction of a 3D printer; setting a coordinate of the output direction of a plane perpendicular to the output direction as a reference coordinate, calculating an initial intersection point between each of the plurality of pixel columns and the 3D model, the initial intersection point having the coordinate of the output direction equal to or greater than the reference coordinate, rasterizing pixels having the reference coordinate in each of the pixel columns; determining a pixel corresponding to a support material region among the rasterized pixels on based on whether the initial intersection point is present; and generating a bitmap of the plane merging the rasterized pixels.

The determining may include determining, as the support material region, a pixel corresponding to empty space when the initial intersection point is present.

The method may further include increasing the reference coordinate by a pixel size of the output direction when the generation of the bitmap of the plane is completed; and returning to the calculating when the increased reference coordinate is equal to or less than a coordinate of an output direction of a top plane in the 3D space or a top coordinate of the output direction of the 3D model.

The method may further include transmitting the bitmap of the plane to the 3D printer.

According to another aspect of the present disclosure, there is provided a computer program combined with hardware and stored in a recording medium to execute a method, the method including dividing a three-dimensional (3D) space into a plurality of pixel columns parallel to an output direction of a 3D printer, calculating intersection points between the plurality of pixel columns and the 3D model, rasterizing the pixel columns, determining a support material region in each of the rasterized pixel columns based on the intersection points, and generating a bitmap of the 3D model by merging the rasterized pixel columns.

According to another aspect of the present disclosure, there is provided a computer program combined with hardware and stored in a recording medium to execute a method, the method including: dividing a three-dimensional (3D) space into a plurality of pixel columns parallel to an output direction of a 3D printer; setting a coordinate of the output direction of a plane perpendicular to the output direction as a reference coordinate; calculating an initial intersection point between each of the plurality of pixel columns and a 3D model, the initial intersection point having the coordinate of the output direction equal to or greater than the reference coordinate; rasterizing pixels having the reference coordinate in each of the pixel columns; determining a pixel corresponding to a support material region among the rasterized pixels based on whether the initial intersection point is present; and generating a bitmap of a plane by merging the rasterized pixels.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION OF EXEMPLARY EMBODIMENTS

Hereinafter, embodiments of the present disclosure will be described in detail with reference to the accompanying drawings. The following detailed description will be provided for better understanding of a method, an apparatus, and/or a system that are disclosed in this specification. However, this is merely exemplary, and the present disclosure is not limited thereto.

In describing embodiments of the present disclosure, when it is determined that detailed description of known techniques associated with the present disclosure would unnecessarily obscure the gist of the present disclosure, the detailed description thereof will be omitted. Also, the terms described below are defined in consideration of the functions in the present disclosure, and thus may vary depending on a user, intention of an operator, or custom. Accordingly, the definition should be made on the basis of the whole specification. The terminology used herein is only for the purpose of describing embodiments of the present disclosure, and should not be restrictive. The singular forms "a," "an" and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Figure 1:
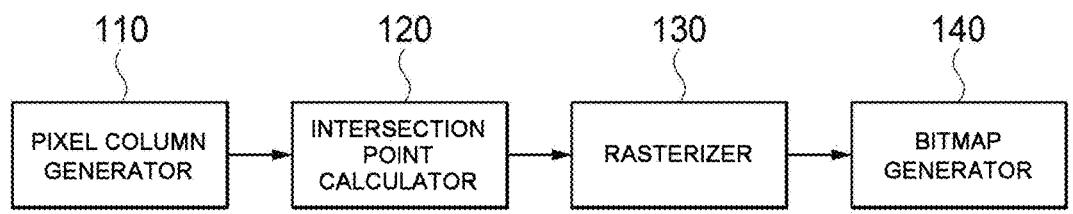
FIG. 1 is a block diagram showing an apparatus for generating a bitmap of a three-dimensional (3D) model according to an embodiment of the present disclosure.

FIG. 1 is a block diagram showing an apparatus for generating a bitmap of a three-dimensional (3D) model according to an embodiment of the present disclosure.

Referring to FIG. 1, an apparatus for generating a bitmap of a 3D model according to an embodiment of the present disclosure includes a pixel column generator 110, an intersection point calculator 120, a rasterizer 130, and a bitmap generator 140.

In the shown example, the apparatus for generating a bitmap of a 3D model is an apparatus for receiving a 3D model and generating a bitmap for an output of a 3D printer. Here, the 3D model may denote, for example, an STL format file.

The apparatus for generating a bitmap of a 3D model shown in FIG. 1 may be implemented as a portion of an apparatus having data storage and calculation capabilities such as a server or a personal computer connected with the 3D printer over a network. However, embodiments of the present disclosure are not limited thereto. The apparatus for generating a bitmap of a 3D model may be implemented as a portion of the 3D printer.

The pixel column generator 110 divides a 3D space into a plurality of pixel columns parallel to an output direction of the 3D printer. Here, the pixel column may denote a rectangular parallelepiped obtained by stacking pixels of the bitmap in the output direction.

Figure 5:
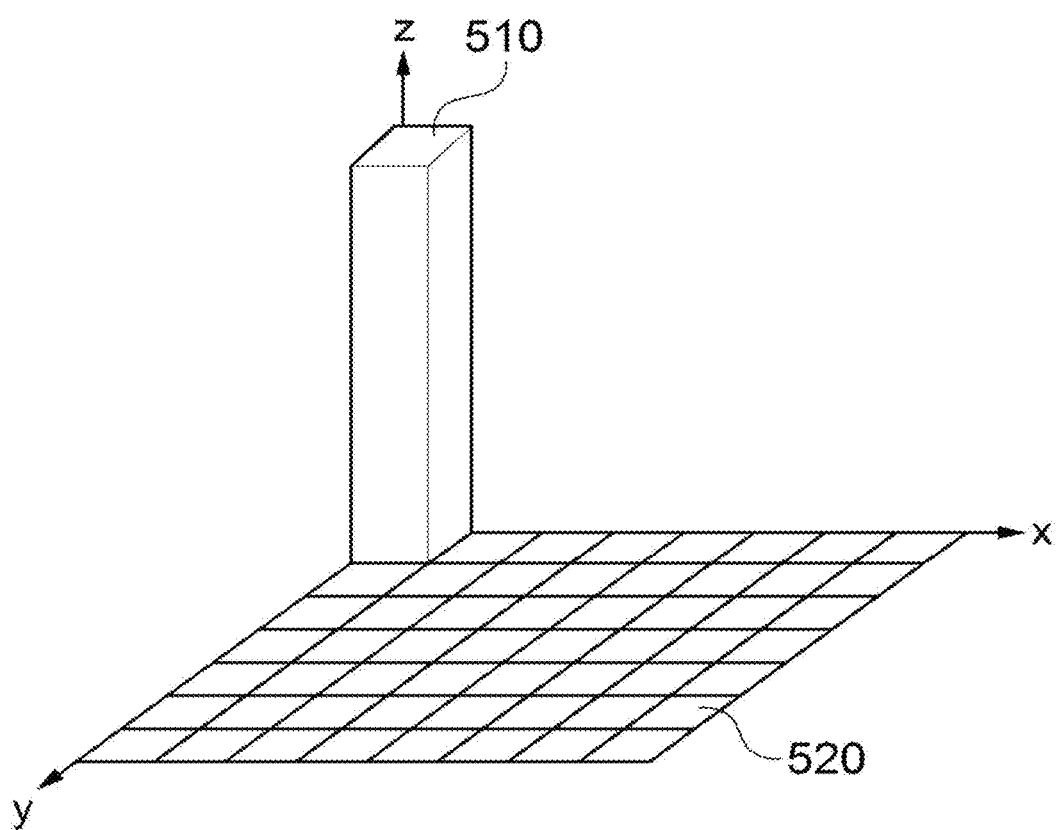
FIG. 5 is an exemplary diagram of a pixel column.

In detail, referring to FIG. 5 and assuming that a Z-axis direction is the output direction of the 3D printer, a pixel column 510 denotes pixels stacked in the Z-axis direction. As shown, a part 520 represented as a grid on an X-Y plane indicates a set of pixels constituting a plane perpendicular to the output direction of the 3D printer.

The intersection point calculator 120 calculates an intersection point between the 3D model and each of the plurality of pixel columns generated by the pixel column generator 110.

Figure 6:
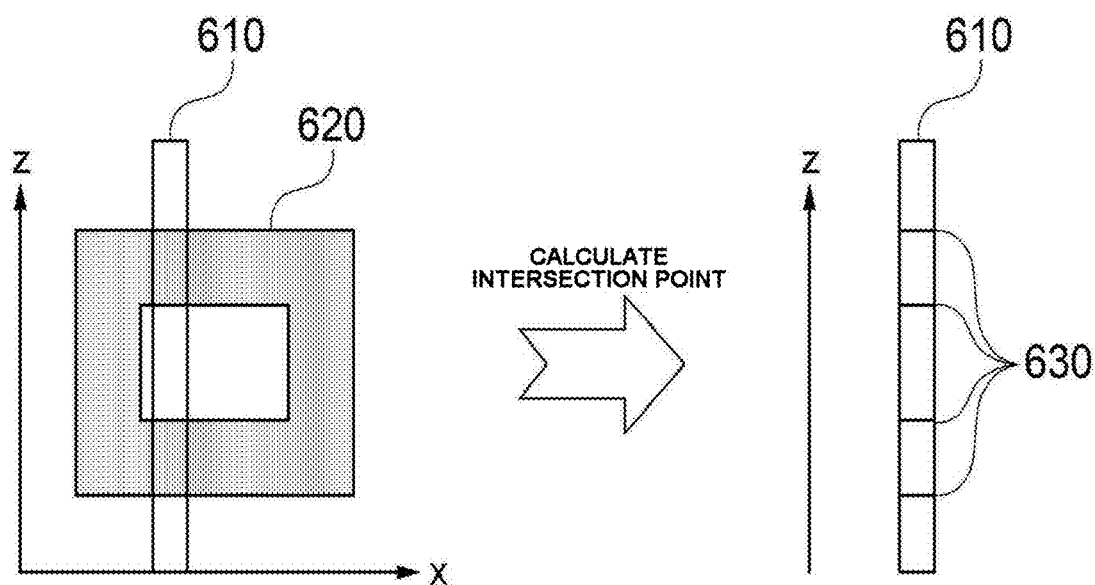
FIG. 6 is an exemplary diagram for describing the calculation of an intersection point according to an embodiment of the present disclosure.

In detail, FIG. 6 shows a two-dimensional (2D) image of a specific pixel column 610 and a 3D model 620 seen in a Y-axis direction. As shown, the pixel column 610 placed at a position where the 3D model 620 is present on the 3D space intersects an outline of the 3D model 620. Accordingly, the intersection point calculator 120 may calculate, as an intersection point 630, a point where the pixel column 610 intersects the outline of the 3D model 620.

For example, when the 3D model is a triangle mesh model, the intersection point calculator 120 may calculate an intersection point using technology such as a plane test, an edge function, etc.

As another example, when the 3D model is a parametric model, the intersection point calculator 120 applies a coordinate for each pixel included in a pixel column to an equation representing each surface of the 3D model to calculate an intersection point.

In addition, the intersection point calculator 120 may use multi-dimensional indexing technology such as k-d tree, R tree, and multi-dimensional segment tree to quickly search for a basic element (e.g., a triangle) of the 3D model, which intersects each pixel column.

The method of the intersection point calculator 120 calculating intersection points between the 3D model and the pixel columns is not limited thereto, and thus various methods may be used to calculate the intersection points.

The rasterizer 130 rasterizes the pixel columns generated by the pixel column generator 110 and determines a support material region in each of the rasterized pixel columns on the basis of the intersection points calculated by the intersection point calculator 120. Here, the support material region denotes a region where a support material, which is a supporter for supporting a floating part when the 3D model is output, is formed.

In detail, the rasterizer 130 may use rasterization technology such as, for example, scan-line conversion to rasterize each pixel column.

Furthermore, the rasterizer 130 may determine whether a pixel corresponding to an empty space of each rasterized pixel column is the support material region.

Figure 7:
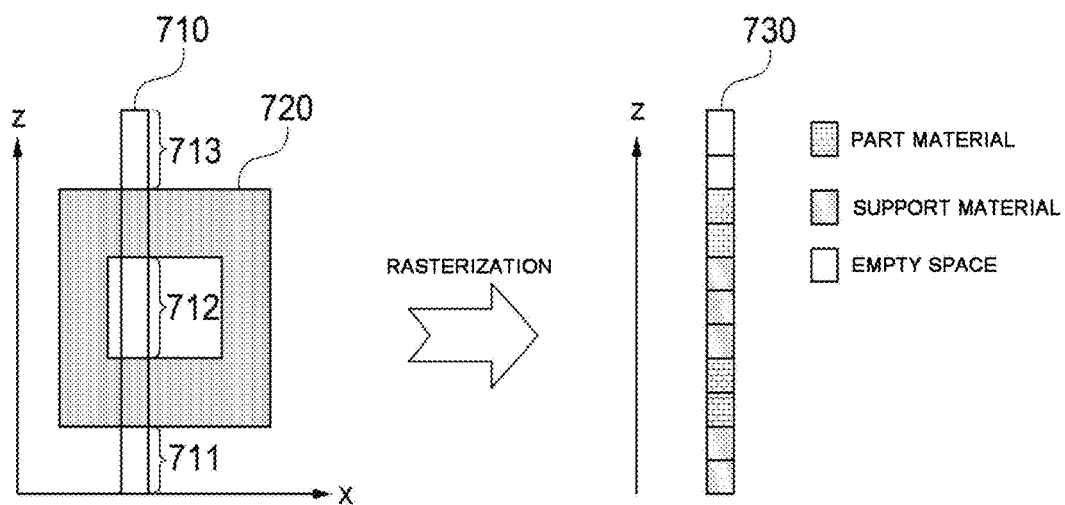
FIG. 7 is an exemplary diagram for describing the determination of a support material region according to an embodiment of the present disclosure.

In detail, referring to FIG. 7, regions 711, 712, and 713 of FIG. 7 correspond to empty spaces on the basis of intersection points between a specific pixel column 710 and a 3D model 720. In addition, each of the regions 711 and 712 among the empty regions corresponds to a region where an object is floating in the air when the object is output by a 3D printer, and thus corresponds to a region where a support material should be formed. Accordingly, among the pixels corresponding to empty spaces in the rasterized pixel column 730, the rasterizer 130 may determine, as the support material region, a pixel included in the region 711 below an initial intersection and a pixel included in the region 712 between intersection points on the basis of the output direction (that is, the Z-axis direction).

Figure 8:
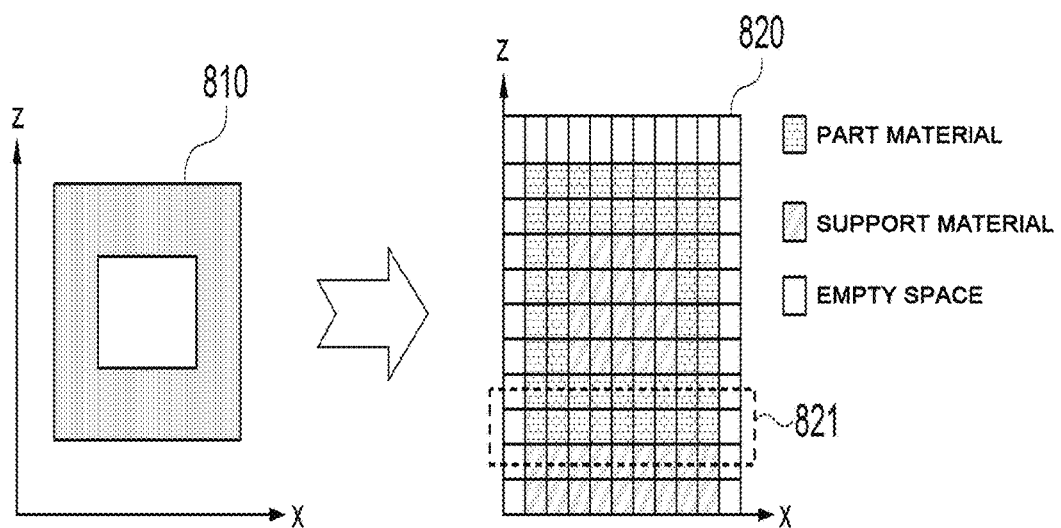
FIG. 8 is an exemplary diagram for describing the generation of a bitmap according to an embodiment of the present disclosure.

The bitmap generator 140 merges pixel columns rasterized by the rasterizer 130 to generate a bitmap of a 3D model. In detail, FIG. 8 is an exemplary diagram showing a 3D model 810 and a bitmap 820 of the 3D model 810 on an X-Z plane in two dimensions. In the shown example, the bitmap 820 of the 3D model 810 includes information regarding all of a part material region and a support material region, and each plane composed of pixels having the same Z-axis in the bitmap 820 corresponds to a bitmap corresponding to each layer output by the 3D printer. That is, in the shown example, a part 821 corresponds to a bitmap of a layer that is output third by the 3D printer.

Meanwhile, according to an exemplary embodiment of the present disclosure, at least one of the pixel column generator 110, the intersection point calculator 120, the rasterizer 130, and the bitmap generator 140 shown in FIG. 1 may be implemented in one or more computing devices including one or more processors and a computer-readable recording medium connected to the processors. The computer-readable recording medium may be located inside or outside the processors, and be connected to the processors by various well-known means. The processor located inside the computing device may allow each computing device to operate according to the exemplary embodiment described herein. For example, the processor may execute an instruction stored in the computer-readable recording medium, and when the instruction stored in the computer-readable recording medium is executed by the processor, the processor may allow the computing device to execute operations according to the exemplary embodiment described herein.

Figure 2:
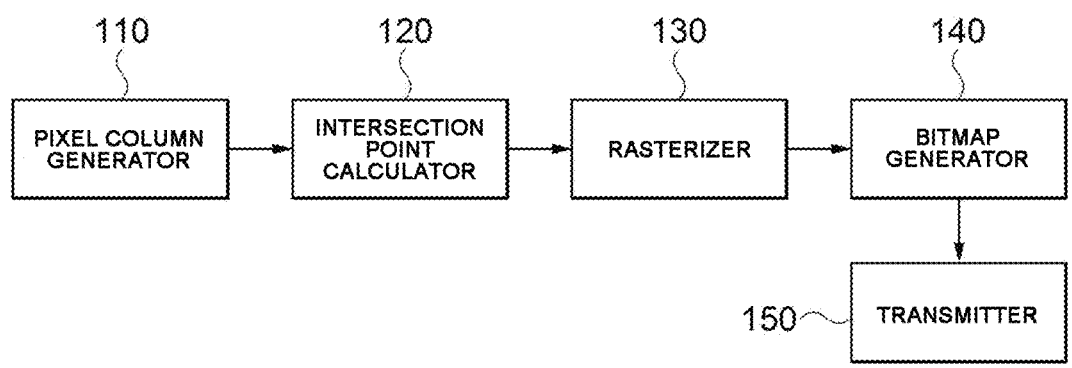
FIG. 2 is a block diagram showing an apparatus for generating a bitmap of a 3D model according to another embodiment of the present disclosure.

FIG. 2 is a block diagram showing an apparatus for generating a bitmap according to another embodiment of the present disclosure.

Referring to FIG. 2, an apparatus for generating a bitmap of a 3D model according to an embodiment of the present disclosure includes a pixel column generator 110, an intersection point calculator 120, a rasterizer 130, a bitmap generator 140, and a transmitter 150.

The apparatus for generating a bitmap of a 3D model shown in FIG. 2 may generate a bitmap of a 3D model and provide the generated bitmap to a 3D printer. For example, the apparatus may be implemented as a portion of an apparatus having data storage and calculation capabilities, such as a server or a personal computer connected with the 3D printer over a network.

In the shown example, the pixel column generator 110, the intersection point calculator 120, the rasterizer 130, and the bitmap generator 140 have the same configurations as those shown in FIG. 1, and thus their detailed description will be omitted.

The transmitter 150 transmits a bitmap generated by the bitmap generator 140 to the 3D printer. Here, various wired or wireless network methods may be used to transmit the bitmap.

According to an embodiment of the present disclosure, among the bitmaps generated by the bitmap generator 140, the transmitter 150 may sequentially transmit bitmaps of planes perpendicular to an output direction on the basis of the output direction of the 3D printer. In detail, referring to FIG. 8, a bitmap in a plane having the same Z coordinate in the bitmap 820 is a bitmap of each layer that is output by the 3D printer, and is also a bitmap of a layer that is output first as the Z coordinate decreases. Accordingly, by sequentially transmitting bitmaps beginning with a bitmap of a plane having a small Z coordinate, the transmitter 150 may reduce the amount of transmissions, and may also perform instant output even before transmitting all of the bitmaps.

Meanwhile, according to an exemplary embodiment of the present disclosure, at least one of the pixel column generator 110, the intersection point calculator 120, the rasterizer 130, the bitmap generator 140 and the transmitter 150 shown in FIG. 2 may be implemented in one or more computing devices including one or more processors and a computer-readable recording medium connected to the processors. The computer-readable recording medium may be located inside or outside the processors, and be connected to the processors by various well-known means. The processor located inside the computing device may allow each computing device to operate according to the exemplary embodiment described herein. For example, the processor may execute an instruction stored in the computer-readable recording medium, and when the instruction stored in the computer-readable recording medium is executed by the processor, the processor may allow the computing device to execute operations according to the exemplary embodiment described herein.

Figure 3:
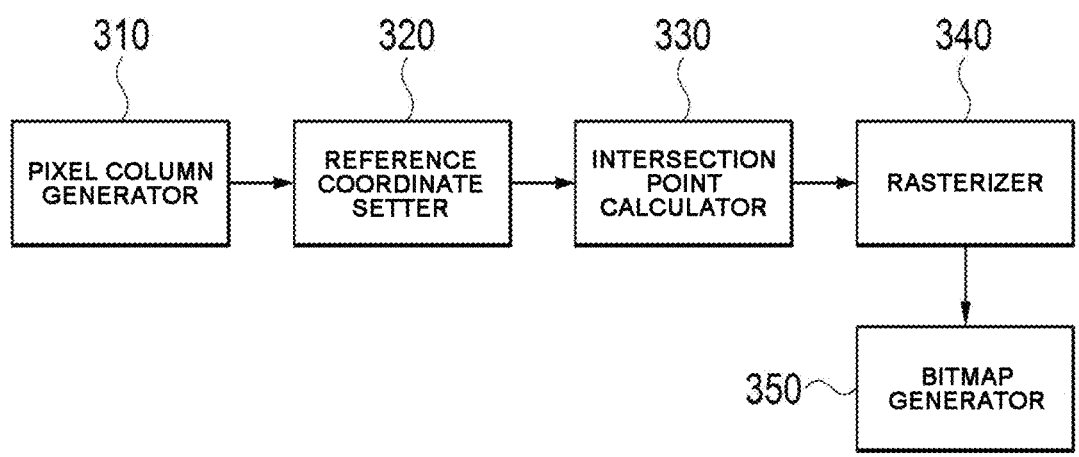
FIG. 3 is a block diagram showing an apparatus for generating a bitmap of a 3D model according to still another embodiment of the present disclosure.

FIG. 3 is a block diagram showing an apparatus for generating a bitmap of a 3D model according to still another embodiment of the present disclosure.

Referring to FIG. 3, an apparatus for generating a bitmap of a 3D model according to an embodiment of the present disclosure includes a pixel column generator 310, a reference coordinate setter 320, an intersection point calculator 330, a rasterizer 340, and a bitmap generator 350.

The apparatus for generating a bitmap of a 3D model shown in FIG. 3 may be implemented as a portion of an apparatus having data storage and calculation capabilities, such as a server or a personal computer connected with a 3D printer over a network. However, embodiments of the present disclosure are not limited thereto. The apparatus for generating a bitmap of a 3D model may be implemented as a portion of the 3D printer.

The pixel column generator 310 has the same configuration as the pixel column generator 110 shown in FIGS. 1 and 2, and thus its detailed description will be omitted.

The reference coordinate setter 320 sets an output direction coordinate of a plane perpendicular to an output direction of the 3D printer as a reference coordinate. For example, assuming that the output direction is parallel to a Z-axis direction on a 3D space, the reference coordinate denotes a Z-axis coordinate of a plane that is parallel to an X-Y plane.

For example, the reference coordinate setter 320 may set an initial value of the reference coordinate as a value of an output direction coordinate of a plane corresponding to a bottom layer on the basis of the output direction. When the generation of a bitmap of a plane having a reference coordinate value is completed, the reference coordinate setter 320 may increase the reference coordinate by a pixel size of the output direction (that is, the Z-axis direction).

The intersection point calculator 330 calculates an initial intersection point between the 3D model and each pixel column having an output direction coordinate equal to or greater than the reference coordinate set by the reference coordinate setter 320 among a plurality of pixel columns generated by the pixel column generator 310. That is, while the intersection point calculator 120 shown in FIGS. 1 and 2 calculates all intersection points between the respective pixel columns and the 3D model, the intersection point calculator 330 shown FIG. 3 calculates only an initial intersection point on the basis of the reference coordinate.

For each of the plurality of pixel columns generated by the pixel column generator 310, the rasterizer 340 rasterizes a pixel with an output direction coordinate having a reference coordinate value set by the reference coordinate setter 320. For example, when the output direction coordinate set by the reference coordinate setter 320 is 3, the rasterizer 340 may rasterize pixels having the output direction coordinate of 3 for each pixel column.

The rasterizer 340 determines a pixel corresponding to a support material region among the pixels corresponding to empty spaces of the rasterized pixel column on the basis of whether the initial intersection point calculated by the intersection point calculator 330 is present.

Operations of the reference coordinate setter 320, the intersection point calculator 330, and rasterizer 340 will be described below with reference to FIGS. 9 and 10.

The bitmap generator 350 generates a bitmap of a plane perpendicular to a 3D output direction by merging pixels rasterized by the rasterizer 340. That is, the rasterizer 340 rasterizes all pixels included in a plane corresponding to a bottom layer and then rasterizes pixels included in a plane corresponding to the next layer on the basis of the output direction of the 3D printer according to the reference coordinate set by the reference coordinate setter 320. Accordingly, the bitmap generator 350 sequentially generates bitmaps beginning with a bitmap of the plane of the bottom layer on the basis of the output direction of the 3D printer by merging pixels rasterized by the rasterizer 340.

Meanwhile, according to an exemplary embodiment of the present disclosure, at least one of the pixel column generator 310, the reference coordinate setter 320, the intersection point calculator 330, the rasterizer 340, and the bitmap generator 350 shown in FIG. 3 may be implemented in one or more computing devices including one or more processors and a computer-readable recording medium connected to the processors. The computer-readable recording medium may be located inside or outside the processors, and be connected to the processors by various well-known means. The processor located inside the computing device may allow each computing device to operate according to the exemplary embodiment described herein. For example, the processor may execute an instruction stored in the computer-readable recording medium, and when the instruction stored in the computer-readable recording medium is executed by the processor, the processor may allow the computing device to execute operations according to the exemplary embodiment described herein.

Figure 4:
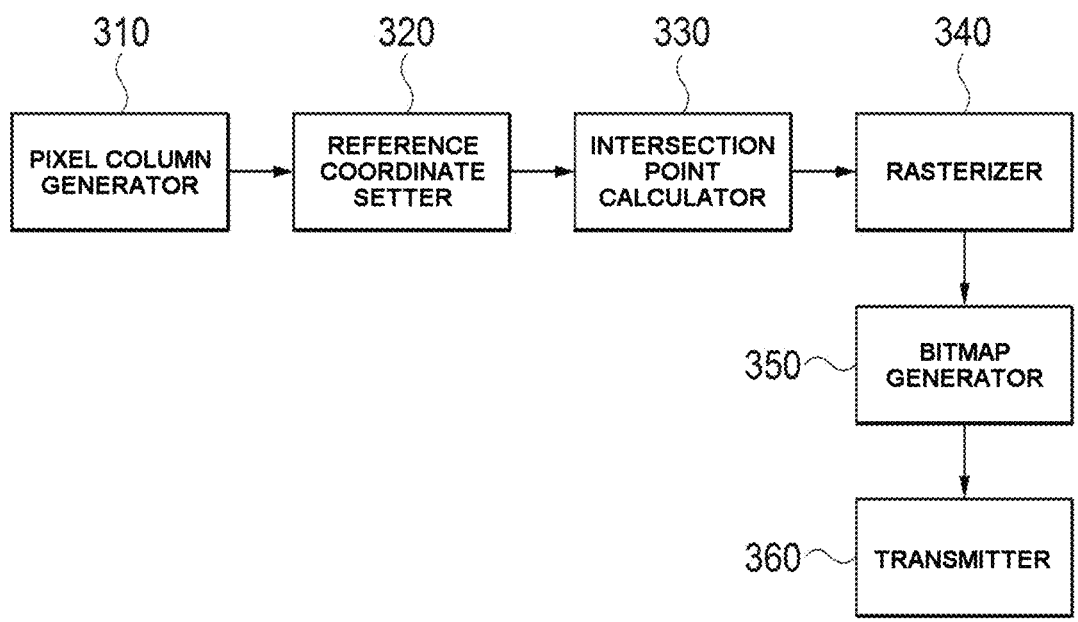
FIG. 4 is a block diagram showing an apparatus for generating a bitmap of a 3D model according to yet another embodiment of the present disclosure.

FIG. 4 is a block diagram showing an apparatus for generating a bitmap of a 3D model according to yet another embodiment of the present disclosure.

Referring to FIG. 4, an apparatus for generating a bitmap of a 3D model according to an embodiment of the present disclosure includes a pixel column generator 310, a reference coordinate setter 320, an intersection point calculator 330, a rasterizer 340, a bitmap generator 350, and a transmitter 360.

The apparatus for generating a bitmap of a 3D model shown in FIG. 4 may provide a bitmap of a 3D model to a 3D printer. For example, the apparatus may be implemented as a portion of an apparatus having data storage and calculation capabilities, such as a server or a personal computer connected with the 3D printer over a network.

In the shown example, the pixel column generator 310, the reference coordinate setter 320, the intersection point calculator 330, the rasterizer 340, and the bitmap generator 350 have the same configurations as those shown in FIG. 3, and thus their detailed description will be omitted.

The transmitter 360 transmits a bitmap generated by the bitmap generator 350 to the 3D printer. Here, various wired or wireless network methods may be used to transmit the bitmap.

In detail, as described with reference to FIG. 3, the bitmap generator 350 generates bitmaps sequentially beginning with a bitmap of a bottom layer on the basis of the output direction of the 3D printer. Accordingly, by transmitting bitmaps sequentially beginning with the bitmap of the bottom layer on the basis of the output direction, the transmitter 360 may reduce the amount of transmissions, and may also perform instant output even before transmitting all of the bitmaps.

Meanwhile, according to an exemplary embodiment of the present disclosure, at least one of the pixel column generator 310, the reference coordinate setter 320, the intersection point calculator 330, the rasterizer 340, the bitmap generator 350, and the transmitter 360 shown in FIG. 4 may be implemented in one or more computing devices including one or more processors and a computer-readable recording medium connected to the processors. The computer-readable recording medium may be located inside or outside the processors, and be connected to the processors by various well-known means. The processor located inside the computing device may allow each computing device to operate according to the exemplary embodiment described herein. For example, the processor may execute an instruction stored in the computer-readable recording medium, and when the instruction stored in the computer-readable recording medium is executed by the processor, the processor may allow the computing device to execute operations according to the exemplary embodiment described herein.

Figure 9:
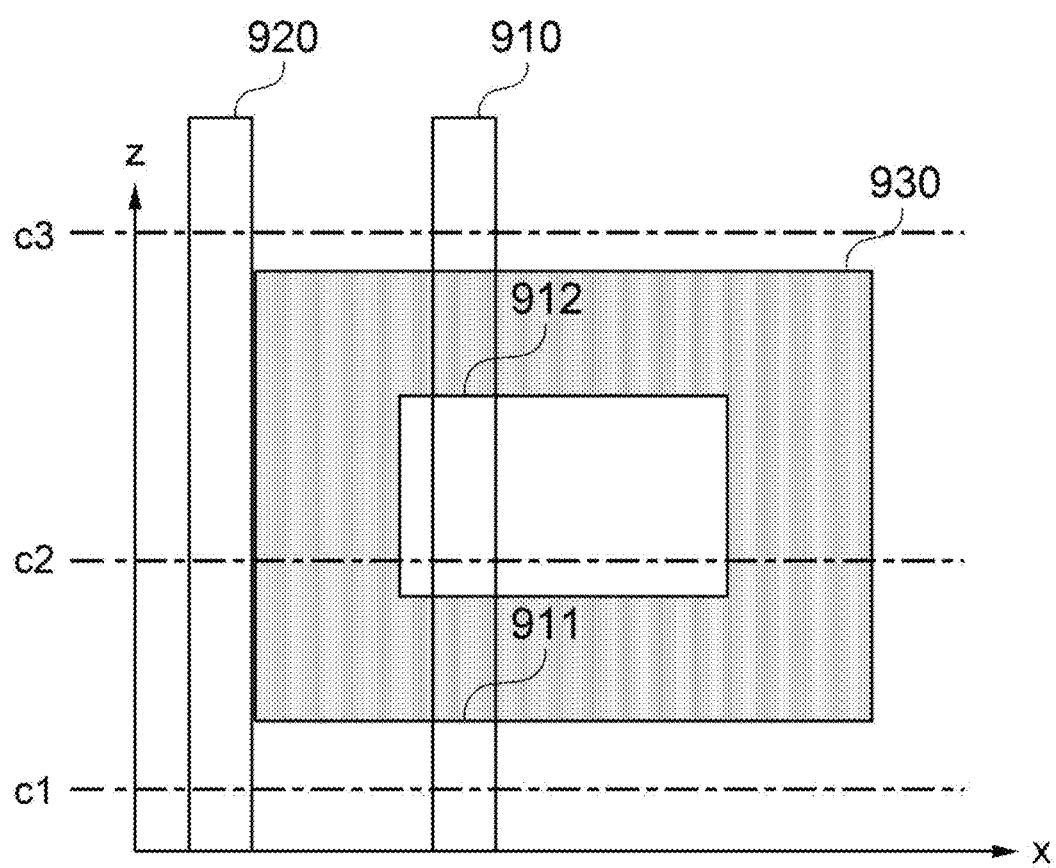
FIG. 9 is an exemplary diagram for describing the determination of a support material region according to another embodiment of the present disclosure.

FIG. 9 is an exemplary diagram for describing the determination of a support material region according to an embodiment of the present disclosure.

In FIG. 9, it is assumed that an output direction of a 3D printer is a Z-axis direction.

Referring to FIG. 9, when it is assumed that a reference coordinate set by the reference coordinate setter 320 is c1, there is an initial intersection point 911 between a pixel column 910 and a 3D model 930. In addition, a pixel of the pixel column 910 having a Z-axis coordinate equal to c1 corresponds to an empty space. Accordingly, the rasterizer 340 may determine the pixel of the pixel column 910 having the Z-axis coordinate equal to c1 as a pixel corresponding to the support material region.

When it is assumed that the reference coordinate is c2, there is an initial intersection point 912 of the pixel column 910 and the 3D model 930. In addition, a pixel of the pixel column 910 having a Z-axis coordinate equal to c2 is a pixel corresponding to an empty space. Accordingly, the reference coordinate setter 320 may determine the pixel of the pixel column 910 having the Z-axis coordinate equal to c2 as a pixel corresponding to the support material region.

When it is assumed that the reference coordinate is c3, there is no initial intersection point between the pixel column 910 and the 3D model 930. Accordingly, the reference coordinate setter 320 may determine a pixel of the pixel column 910 having a Z-axis coordinate equal to c3 as a pixel corresponding to empty space.

Since a pixel column 920 does not intersect the 3D model 930, there is no initial intersection point when the reference coordinate is c1, c2, or c3. Accordingly, the reference coordinate setter 320 may determine a pixel of the pixel column 920 having a Z-axis coordinate equal to c1, c2, or c3 as a pixel corresponding to empty space.

Figure 10:
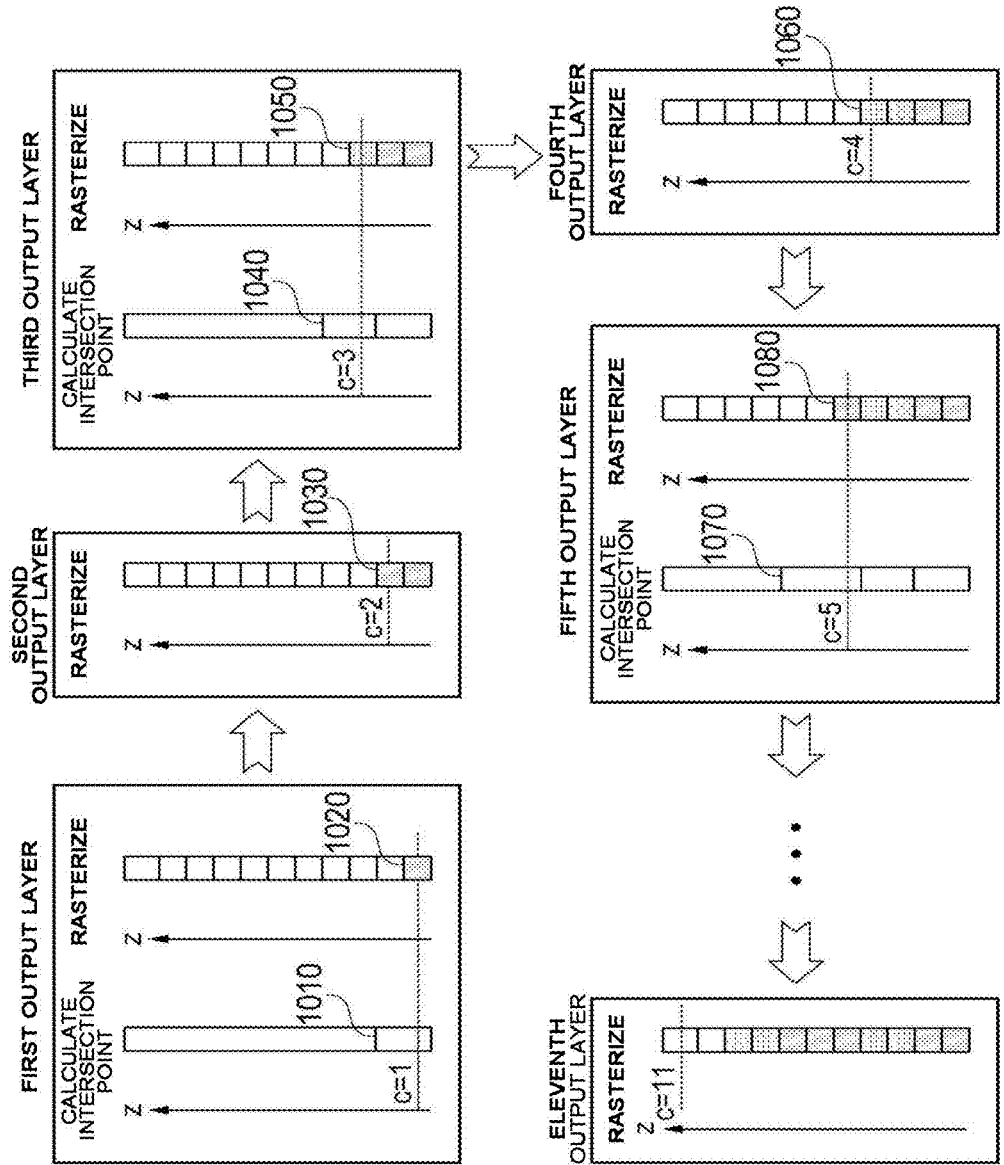
FIG. 10 is an exemplary diagram for describing a process of calculating an intersection point and performing rasterization according to an embodiment of the present disclosure.

FIG. 10 is an exemplary diagram for describing a process of calculating an intersection point and performing rasterization according to an embodiment of the present disclosure.

In FIG. 10, it is assumed that an output direction of a 3D printer is a Z-axis direction. It is further assumed that each pixel column includes 11 pixels and the magnitude of the Z-axis direction of each pixel included in the pixel column is 1. In addition, in the shown example, c denotes a reference coordinate.

The reference coordinate setter 320 may set a Z-axis coordinate of a plane for a bottom layer as the reference coordinate (that is, c=1) on the basis of the output direction. Subsequently, for each pixel column, the intersection point calculator 330 may calculate an initial intersection point 1010 having a Z-axis coordinate equal to or greater than 1, which is the reference coordinate. Subsequently, for each pixel column, the rasterizer 340 may rasterize a pixel 1020 having a Z-axis coordinate equal to 1, which is the reference coordinate, and may determine whether the rasterized pixel corresponds to a support material region. In the shown example, when the pixel 1020 having a value of 1, which is the reference coordinate, corresponds to empty space, there is the initial intersection point 1010. Thus, the rasterizer 340 may determine that the pixel 1020 corresponds to the support material region.

When the rasterization of the pixels having the reference coordinate c equal to 1 for each pixel column is completed, the reference coordinate setter 320 may increase the reference coordinate c by 1, which is the size of the Z-axis direction of each pixel, to change the reference coordinate c to 2.

Subsequently, for each pixel column, the intersection point calculator 330 may calculate an initial intersection point having a Z-axis coordinate equal to or greater than 2, which is the reference coordinate. In the shown example, when there is an initial intersection point calculated for a specific pixel column on the basis of the reference coordinate before the change, and also the changed reference coordinate is less than a Z-axis coordinate of the initial intersection point, the process of calculating the initial intersection point may be omitted. That is, in the shown example, the Z-axis coordinate of the initial intersection point 1010 calculated on the basis of 1, which is the reference coordinate before the change, is equal to or greater than 2, which is the changed reference coordinate, and thus the process of calculating the initial intersection point may be omitted.

When a region corresponding to a pixel 1030 having a value of 2, which is the reference coordinate in a 3D space, corresponds to empty space, there is the initial intersection point 1010 equal to or greater than the reference coordinate. Thus, the rasterizer 340 may determine that the pixel 1030 corresponds to the support material region.

When the rasterization of the pixels having the reference coordinate c equal to 2 for each pixel column is completed, the reference coordinate setter 320 may increase the reference coordinate c by 1, which is the size of the Z-axis direction of each pixel, to change the reference coordinate c to 3.

Subsequently, for each pixel column, the intersection point calculator 330 may calculate an initial intersection point 1040 having a Z-axis coordinate equal to or greater than 3, which is the reference coordinate. Subsequently, for each pixel column, the rasterizer 340 may rasterize a pixel 1050 having the Z-axis coordinate equal to 3, which is the reference coordinate, and may determine whether the rasterized pixel corresponds to the support material region.

When there is a 3D model in a region between the intersection points 1010 and 1040 in the 3D space, the pixel 1050 does not correspond to empty space. Thus, the rasterizer 340 may determine that the pixel 1050 corresponds to a part material region.

When the rasterization of the pixels having the reference coordinate c equal to 3 for each pixel column is completed, the reference coordinate setter 320 may increase the reference coordinate c by 1, which is the size of the Z-axis direction of each pixel, to change the reference coordinate c to 4.

Subsequently, for each pixel column, the intersection point calculator 330 may calculate an initial intersection point having a Z-axis coordinate equal to or greater than 4, which is the reference coordinate. However, there is the initial intersection point 1040 calculated on the basis of 3, which is the reference coordinate before the change, for the shown pixel column, and the changed reference coordinate is less than a Z-axis coordinate of the initial intersection point 1040. Thus, the process of calculating the initial intersection point may be omitted for the pixel column.

As described above, when there is a 3D model in the region between the intersection points 1010 and 1040, the pixel 1060 does not correspond to empty space. Thus, the rasterizer 340 may determine that the pixel 1060 corresponds to the part material region.

When the rasterization of the pixels having the reference coordinate c equal to 4 for each pixel column is completed, the reference coordinate setter 320 may increase the reference coordinate c by 1, which is the size of the Z-axis direction of each pixel, to change the reference coordinate c to 5.

Subsequently, for each pixel column, the intersection point calculator 330 may calculate an initial intersection point 1070 having a Z-axis coordinate equal to or greater than 5, which is the reference coordinate. In detail, when a region corresponding to a pixel 1080 having a value of 5, which is the reference coordinate in the 3D space, corresponds to empty space, there is the initial intersection point 1070. Thus, the rasterizer 340 may determine that the pixel 1080 corresponds to the support material region.

When the reference coordinate c set by the reference coordinate setter 320 is greater than a Z-axis coordinate of a top plane in the 3D space or a top Z-axis coordinate of the 3D model, the intersection point calculator 330 and the rasterizer 340 may end the calculation of the initial intersection point and the rasterization. In this case, the Z-axis coordinate of the top plane in the 3D space may be a top coordinate of the Z-axis direction of the pixel column.

In detail, in the shown example, assuming that a Z-axis coordinate of a pixel positioned at the top of the pixel column is 11, when the reference coordinate c set by the reference coordinate setter 220 is 12, the reference coordinate c is greater than the top coordinate of the pixel column, and thus the intersection point calculator 330 and the rasterizer 340 may end the initial intersection point calculation and the rasterization.

Figure 11:
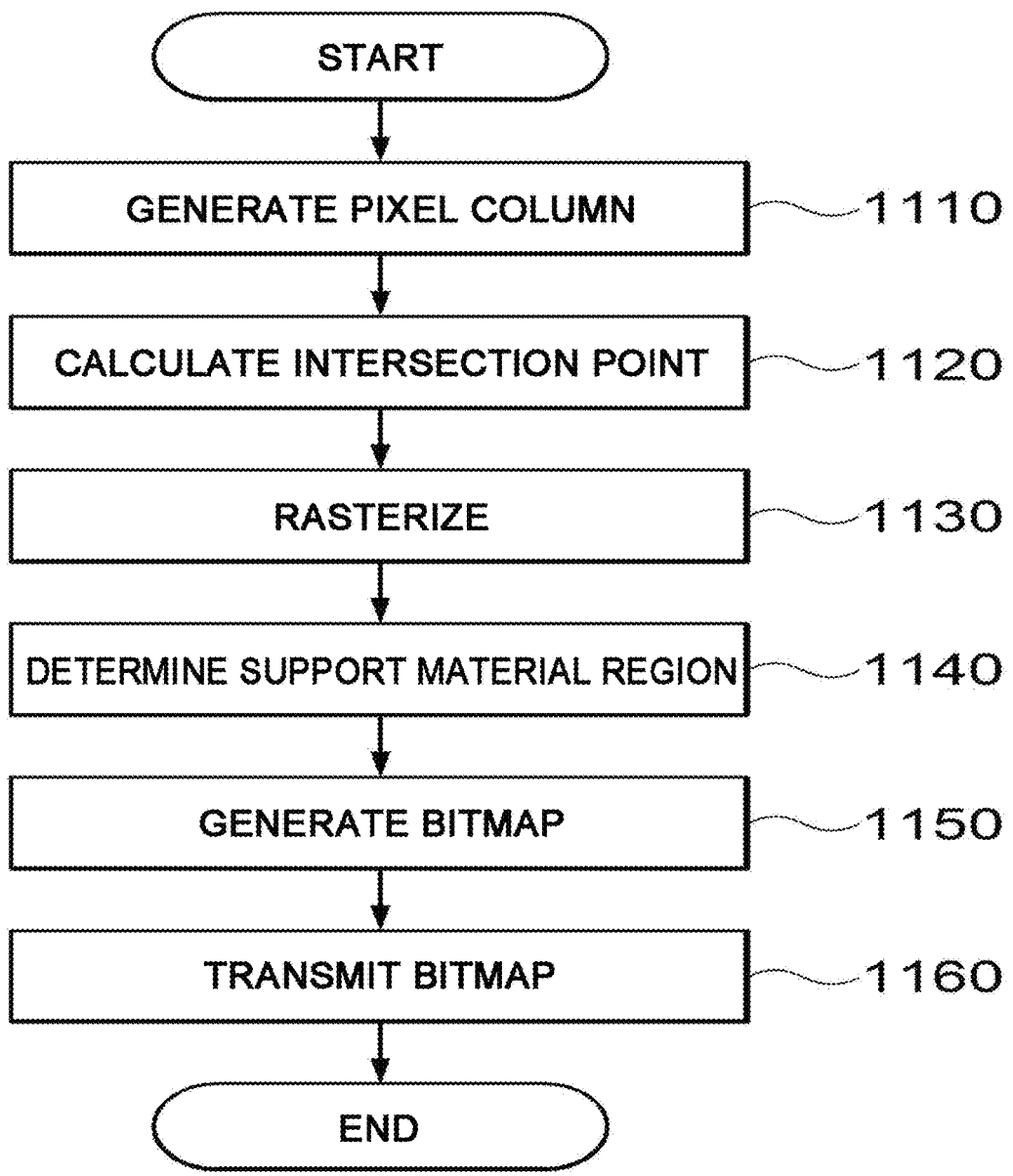
FIG. 11 is a flowchart showing a method of generating a bitmap of a 3D model according to an embodiment of the present disclosure.

FIG. 11 is a flowchart showing a method of generating a bitmap of a 3D model according to an embodiment of the present disclosure.

For example, the method shown in FIG. 11 may be performed by the apparatus for generating a bitmap of a 3D model shown in FIG. 1 or FIG. 2.

The apparatus for generating a bitmap of a 3D model generates a plurality of pixel columns by dividing a 3D space in a direction parallel to an output direction of a 3D printer (S1110).

Subsequently, the apparatus for generating a bitmap of a 3D model calculates intersection points between the plurality of pixel columns and the 3D model (S1120).

Subsequently, the apparatus for generating a bitmap of a 3D model rasterizes the pixel columns (S1130) and determines a support material region in each of the rasterized pixel columns on the basis of the intersection points (S1140).

In this case, the apparatus for generating a bitmap of a 3D model may determine, as the support material region, a pixel positioned between intersection points among pixels corresponding to empty spaces in each of the rasterized pixel columns.

In addition, the apparatus for generating a bitmap of a 3D model may determine, as the support material region, a pixel positioned below an initial intersection point among the pixels corresponding to empty spaces in each of the rasterized pixel columns.

Subsequently, the apparatus for generating a bitmap of a 3D model generates the bitmap of the 3D model by merging the rasterized pixel columns (S1150).

Subsequently, the apparatus for generating a bitmap of a 3D model transmits the generated bitmap to the 3D printer (S1160). In this case, the apparatus for generating a bitmap of a 3D model may sequentially transmit bitmaps of a plane perpendicular to the output direction of the 3D printer on the basis of the output direction.

When the apparatus for generating a bitmap of a 3D model is implemented as a portion of the 3D printer, S1160 may be omitted from FIG. 11.

Figure 12:
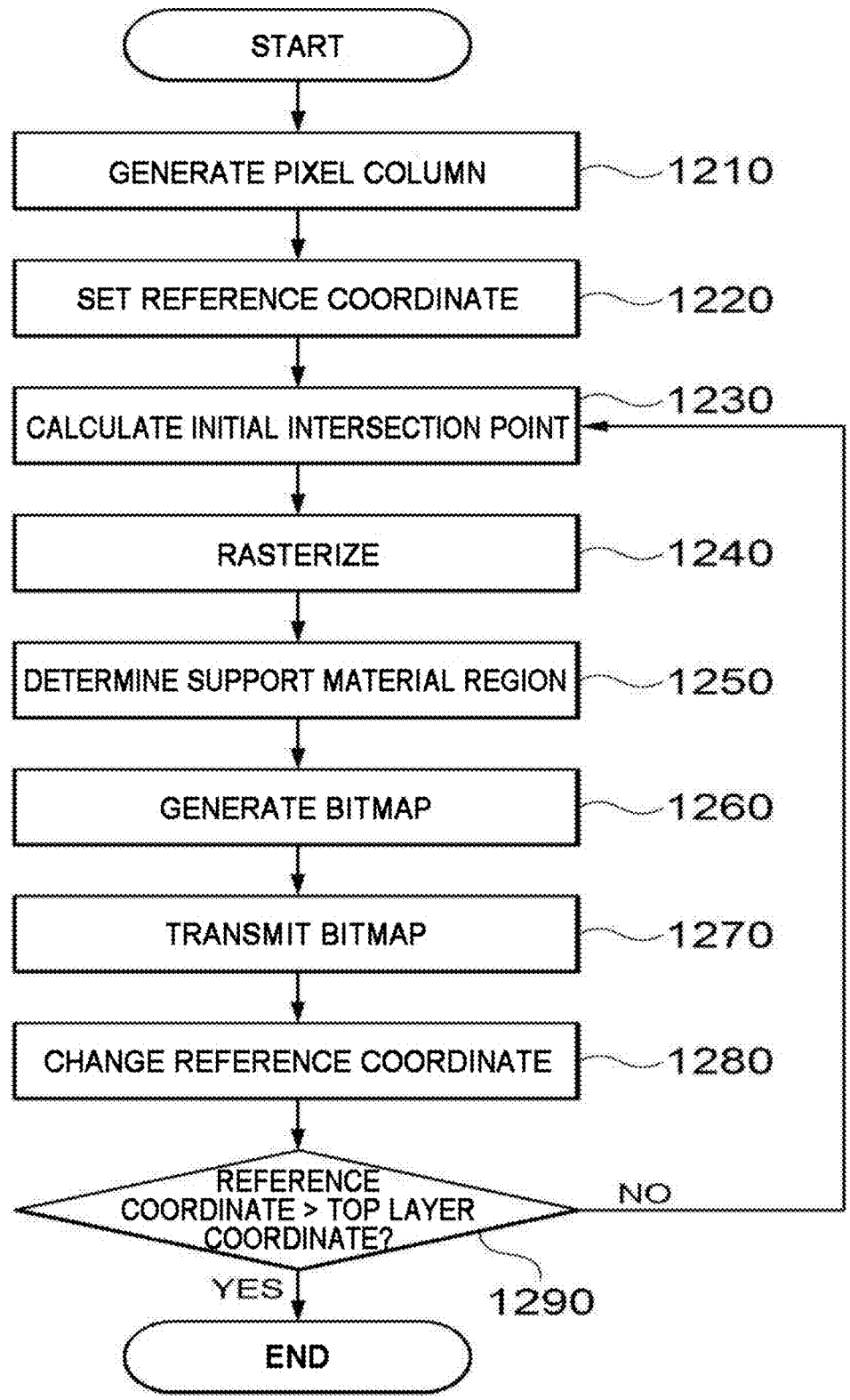
FIG. 12 is a flowchart showing a method of generating a bitmap of a 3D model according to another embodiment of the present disclosure.

FIG. 12 is a flowchart showing a method of generating a bitmap of a 3D model according to another embodiment of the present disclosure.

For example, the method shown in FIG. 12 may be performed by the apparatus for generating a bitmap of a 3D model shown in FIG. 3 or FIG. 4.

The apparatus for generating a bitmap of a 3D model generates a plurality of pixel columns by dividing a 3D space in a direction parallel to an output direction of a 3D printer (S1210).

Subsequently, the apparatus for generating a bitmap of a 3D model sets a coordinate of the output direction of a plane perpendicular to the output direction of the 3D printer as a reference coordinate (S1220).

Subsequently, the apparatus for generating a bitmap of a 3D model calculates an initial intersection point between each of the plurality of pixel columns and the 3D model, which has the output direction coordinate equal to or greater than the reference coordinate (S1230).

Subsequently, the apparatus for generating a bitmap of a 3D model rasterizes pixels having the reference coordinate in each of the pixel columns (S1240) and determines a pixel corresponding to a support material region among the rasterized pixels on the basis of whether there is an initial intersection point (S1250).

In this case, when there is an initial intersection point for each pixel column, the apparatus for generating a bitmap of a 3D model may determine, as the support material region, a pixel corresponding to empty space in the pixel column.

Subsequently, the apparatus of generating a bitmap of a 3D model generates a bitmap of any plane perpendicular to the output direction by merging the rasterized pixels (S1260).

Subsequently, the apparatus for generating a bitmap of a 3D model increases the reference coordinate by a pixel size in the output direction (S1280) and determines whether the changed reference coordinate exceeds a coordinate of a top plane in the 3D space or a top coordinate of the 3D model on the basis of the output direction (S1290).

In this case, when the changed reference coordinate does not exceed the coordinate of the top plane, the apparatus for generating a bitmap of a 3D model repeats S1230 to S1290 until the changed reference coordinate exceeds the coordinate of the top plane.

When the apparatus for generating a bitmap of a 3D model is implemented as a portion of the 3D printer, S1270 may be omitted from FIG. 12. In the flowcharts shown in FIGS. 11 and 12, the method has been described to have a plurality of steps. However, at least some of the steps may be performed in a changed order, performed in combination with another step, omitted, divided into sub-steps and then performed, or performed in addition to one or more steps that are not shown.

Embodiments of the present disclosure may include a computer-readable recording medium including a program for performing methods described in this specification on a computer. The computer-readable recording medium may include any one or a combination of a program instruction, a local data file, a local data structure, etc. The medium may be designed and configured specifically for the present disclosure or can be typically available in the field of computer software. Examples of the computer-readable recording medium include a magnetic medium, such as a hard disk, a floppy disk, and a magnetic tape, an optical recording medium, such as a compact disc read only memory (CD-ROM) and a digital versatile disc (DVD), a magneto-optical medium, such as a floppy disk, and a hardware device specially configured to store and perform a program instruction, such as a ROM, a random access memory (RAM), and a flash memory. Examples of the program instruction may include a high-level language code executable by a computer with an interpreter, in addition to a machine language code made by a compiler.

According to embodiments of the present disclosure, it is possible to reduce the amount of calculations needed to generate a bitmap by finding a part material region and a support material region in a single execution path once when the bitmap is generated.

According to embodiments of the present disclosure, it is also possible to significantly reduce the amount of memory usage and allow parallel processing by calculating a bitmap of one layer independently from a bitmap of another layer.

According to embodiments of the present disclosure, it is also possible to reduce an output standby time by first calculating a bitmap of a bottom layer on the basis of an output direction of a 3D printer and then starting instant output of the bitmap.

Although embodiments of the present disclosure have been described in detail, it should be understood by those skilled in the art that various changes may be made without departing from the spirit or scope of the present disclosure. Thus, the scope of the present disclosure is to be determined by the following claims and their equivalents, and shall not be restricted or limited by the foregoing detailed description.

What is claimed is:

1. An apparatus for generating a bitmap of a three-dimensional (3D) model, the apparatus comprising:
   a pixel column generator configured to divide a 3D space into a plurality of pixel columns parallel to an output direction of a 3D printer;
   an intersection point calculator configured to calculate intersection points between each of the plurality of pixel columns and an outline of the 3D model;
   a rasterizer configured to rasterize the pixel columns and determine a support material region in each of the rasterized pixel columns based on the intersection points; and
   a bitmap generator configured to generate the bitmap of the 3D model by merging the rasterized pixel columns.

2. The apparatus of claim 1, wherein the rasterizer determines, as the support material region, a pixel positioned between the intersection points among pixels corresponding to empty spaces in each of the rasterized pixel columns.

3. The apparatus of claim 1, wherein the rasterizer determines, as the support material region, a pixel positioned below an initial intersection point among pixels corresponding to empty spaces in each of the rasterized pixel columns.

4. The apparatus of claim 1, further comprising a transmitter configured to transmit the bitmap to the 3D printer.

5. The apparatus of claim 4, wherein the transmitter sequentially transmits bitmaps of a plane perpendicular to the output direction on the basis of the output direction.

6. A method of generating a bitmap of a three-dimensional (3D) model, the method comprising:
   dividing a 3D space into a plurality of pixel columns parallel to an output direction of a 3D printer;
   calculating intersection points between each of the plurality of pixel columns and an outline of the 3D model;
   rasterizing the pixel columns;
   determining a support material region in each of the rasterized pixel columns based on the intersection points; and
   generating the bitmap of the 3D model by merging the rasterized pixel columns.

7. The method of claim 6, wherein the determining comprises determining, as the support material region, a pixel positioned between the intersection points among pixels corresponding to empty spaces in each of the rasterized pixel columns.

8. The method of claim 6, wherein the determining comprises determining, as the support material region, a pixel positioned below an initial intersection point among pixels corresponding to empty spaces in each of the rasterized pixel columns.

9. The method of claim 6, further comprising transmitting the bitmap to the 3D printer.

10. The method of claim 9, wherein the transmitting comprises sequentially transmitting bitmaps of a plane perpendicular to the output direction on the basis of the output direction.

11. An apparatus for generating a bitmap of a three-dimensional (3D) model, the apparatus comprising:
- a pixel column generator configured to divide a 3D space into a plurality of pixel columns parallel to an output direction of a 3D printer;
- a reference coordinate setter configured to set a coordinate of the output direction of a plane perpendicular to the output direction as a reference coordinate;
- an intersection point calculator configured to calculate an initial intersection point between each of the plurality of pixel columns and an outline of the 3D model, the initial intersection point having the coordinate of the output direction equal to or greater than the reference coordinate;
- a rasterizer configured to rasterize pixels having the reference coordinate in each of the pixel columns and determine a pixel corresponding to a support material region among the rasterized pixels based on whether the initial intersection point is present; and
- a bitmap generator configured to generate a bitmap of the plane by merging the rasterized pixels.

12. The apparatus of claim 11, wherein the rasterizer determines, as the support material region, a pixel corresponding to empty space when the initial intersection point is present.

13. The apparatus of claim 11, wherein,
- the reference coordinate setter increases the reference coordinate by a pixel size of the output direction when the generation of the bitmap of the plane is completed, and
- the intersection point calculator and the rasterizer end the initial intersection point calculation and the rasterization when the reference coordinate is greater than a coordinate of an output direction of a top plane in the 3D space or a top coordinate of the output direction of the 3D model.

14. The apparatus of claim 11, further comprising a transmitter configured to transmit the bitmap of the plane to the 3D printer.

15. A method of generating a bitmap of a three-dimensional (3D) model, the method comprising:
- dividing a 3D space into a plurality of pixel columns parallel to an output direction of a 3D printer;
- setting a coordinate of the output direction of a plane perpendicular to the output direction as a reference coordinate;
- calculating an initial intersection point between each of the plurality of pixel columns and an outline of the 3D model, the initial intersection point having the coordinate of the output direction equal to or greater than the reference coordinate;
- rasterizing pixels having the reference coordinate in each of the pixel columns;
- determining a pixel corresponding to a support material region among the rasterized pixels based on whether the initial intersection point is present; and
- generating a bitmap of the plane by merging the rasterized pixels.

16. The method of claim 15, wherein the determining comprises determining, as the support material region, a pixel corresponding to empty space when the initial intersection point is present.

17. The method of claim 15, further comprising:
- increasing the reference coordinate by a pixel size of the output direction when the generation of the bitmap of the plane is completed; and
- returning to the calculating when the increased reference coordinate is equal to or less than a coordinate of an output direction of a top plane in the 3D space or a top coordinate of the output direction of the 3D model.

18. The method of claim 15, further comprising transmitting the bitmap of the plane to the 3D printer.

19. A computer program combined with hardware and stored in a recording medium to execute a method, the method comprising:
- dividing a three-dimensional (3D) space into a plurality of pixel columns parallel to an output direction of a 3D printer;
- calculating intersection points between each of the plurality of pixel columns and an outline of a 3D model;
- rasterizing the pixel columns;
- determining a support material region in each of the rasterized pixel columns based on the intersection points; and
- generating a bitmap of the 3D model by merging the rasterized pixel columns.

20. A computer program combined with hardware and stored in a recording medium to execute a method, the method comprising:
- dividing a three-dimensional (3D) space into a plurality of pixel columns parallel to an output direction of a 3D printer;
- setting a coordinate of the output direction of a plane perpendicular to the output direction as a reference coordinate;
- calculating an initial intersection point between each of the plurality of pixel columns and an outline of a 3D model, the initial intersection point having the coordinate of the output direction equal to or greater than the reference coordinate;
- rasterizing pixels having the reference coordinate in each of the pixel columns;
- determining a pixel corresponding to a support material region among the rasterized pixels based on whether the initial intersection point is present; and
- generating a bitmap of the plane by merging the rasterized pixels.

* * * * *